(12) United States Patent
Kobayashi

(10) Patent No.: US 10,928,582 B2
(45) Date of Patent: Feb. 23, 2021

(54) DISPLAY DEVICE

(71) Applicant: FUNAI ELECTRIC CO., LTD., Osaka (JP)

(72) Inventor: Tomohiro Kobayashi, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 16/548,782

(22) Filed: Aug. 22, 2019

(65) Prior Publication Data

US 2020/0064543 A1 Feb. 27, 2020

(30) Foreign Application Priority Data

Aug. 23, 2018 (JP) .............................. JP2018-155978

(51) Int. Cl.
*F21V 8/00* (2006.01)
*H05K 7/20* (2006.01)

(52) U.S. Cl.
CPC ......... *G02B 6/0088* (2013.01); *G02B 6/0031* (2013.01); *G02B 6/0055* (2013.01); *H05K 7/20972* (2013.01)

(58) Field of Classification Search
CPC .................................................. G02B 6/0088
See application file for complete search history.

(56) References Cited

U.S. PATENT DOCUMENTS

| 2012/0162570 A1* | 6/2012 | Lee | G02F 1/133308 349/58 |
|---|---|---|---|
| 2013/0100357 A1* | 4/2013 | Yokawa | G02B 6/0088 348/725 |
| 2013/0242541 A1* | 9/2013 | Kim | G02B 6/0096 362/97.1 |
| 2014/0204307 A1* | 7/2014 | Ogi | G02F 1/133604 349/58 |
| 2015/0103288 A1* | 4/2015 | Lee | G02F 1/133608 349/58 |
| 2016/0231622 A1* | 8/2016 | Kim | G02B 6/0021 |
| 2018/0341056 A1* | 11/2018 | Horiuchi | H04N 5/64 |
| 2020/0116916 A1* | 4/2020 | Li | G02B 6/0053 |

FOREIGN PATENT DOCUMENTS

| EP | 3056930 | 8/2016 |
| JP | 2014115436 | 6/2014 |
| WO | 2013152512 | 10/2013 |

* cited by examiner

*Primary Examiner* — Sang V Nguyen
(74) *Attorney, Agent, or Firm* — JCIPRNET

(57) ABSTRACT

A display device of which an entire thickness in front and rear directions can be reduced and in which temperature of a lower portion can be prevented from being high is provided. A television device (display device) (100) includes a light source part (2), an optical sheet (5), and a rear frame (6). The light source part (2) is disposed in the upper portion of the television device (television device) (100) and a hollow light-guiding region (7) is provided between the reflection sheet (4) and the optical sheet (5). In the reflection sheet (4), a distance to the optical sheet (5) is less in the lower portion than in the upper portion.

15 Claims, 13 Drawing Sheets

SECTIONAL VIEW TAKEN LONG LINE 600-600

SECTIONAL VIEW TAKEN LONG LINE 600-600

SECTIONAL VIEW TAKEN LONG LINE 600-600

SECTIONAL VIEW TAKEN LONG LINE 600-600

DISPLAY DEVICE

CROSS-REFERENCE TO RELATED APPLICATION

This application claims the priority benefit of Japan application serial no. 2018-155978, filed on Aug. 23, 2018. The entirety of the above-mentioned patent application is hereby incorporated by reference herein and made a part of this specification.

BACKGROUND

Technical Field

The disclosure relates to a display device and particularly to a display device including a display part and a light source part.

Description of Related Art

In the related art, display devices including display parts and light source parts are known (for example, see Patent Document 1: Japanese Laid-open No. 2014-115436).
Patent Documents Japanese Laid-open No. 2014-115436 discloses a display device that includes a display panel (a display part), a backlight (a light source part) radiating the display panel, and a main substrate (a component part) performing light emission control of the backlight (the light source part). In the display device, the main substrate is provided in a lower portion of the display device along with a light source.

However, in the display device of the related art, as disclosed in Patent Document 1, a thick component part such as a main substrate on which a speaker or an electronic component is mounted is provided on the rear surface side in the lower portion because of a relation between wirings. Therefore, when the light source part is provided in the lower portion of the display device, the entire thickness in the front and rear directions of the display device increases by a sum of a distance from the display part side of the display device to the light source part and a distance from the light source part to the component part. The light source part and the electronic component mounted on a substrate emit heat. Therefore, when the light source part and the component part are provided in the lower portion, the temperature of the lower portion of the display device may become high.

SUMMARY

According to an embodiment of the disclosure, there is provided a display device including: a display part including a display surface on which an image is displayed; a light source part including a plurality of LEDs; a lens mounted to cover the light source part and to refract and reflect light of the light source part; a reflection sheet provided on a rear surface side opposite to the display surface of the display part and configured to reflect the light refracted and reflected by the lens; an optical sheet disposed between the display part and the reflection sheet and configured to be parallel to the display part; and a rear frame configured to cover the reflection sheet on the rear surface side. The light source part is disposed in an upper portion of the display device. A hollow light-guiding region is provided between the reflection sheet and the optical sheet. The reflection sheet is configured such that a distance to the optical sheet is less in a lower portion than in the upper portion.

DESCRIPTION OF THE EMBODIMENTS

The embodiments of the disclosure provide a display device of which the entire thickness in the front and rear directions can be decreased and in which temperature of the lower portion of the display device can be prevented from becoming high.

Hereinafter, embodiments of the disclosure will be described with reference to the drawings.

First Embodiment

A configuration of a television device 100 according to a first embodiment of the disclosure will be described with reference to FIGS. 1 to 7. The television device 100 is an example of a "display device" of the claims.

Figure 1:
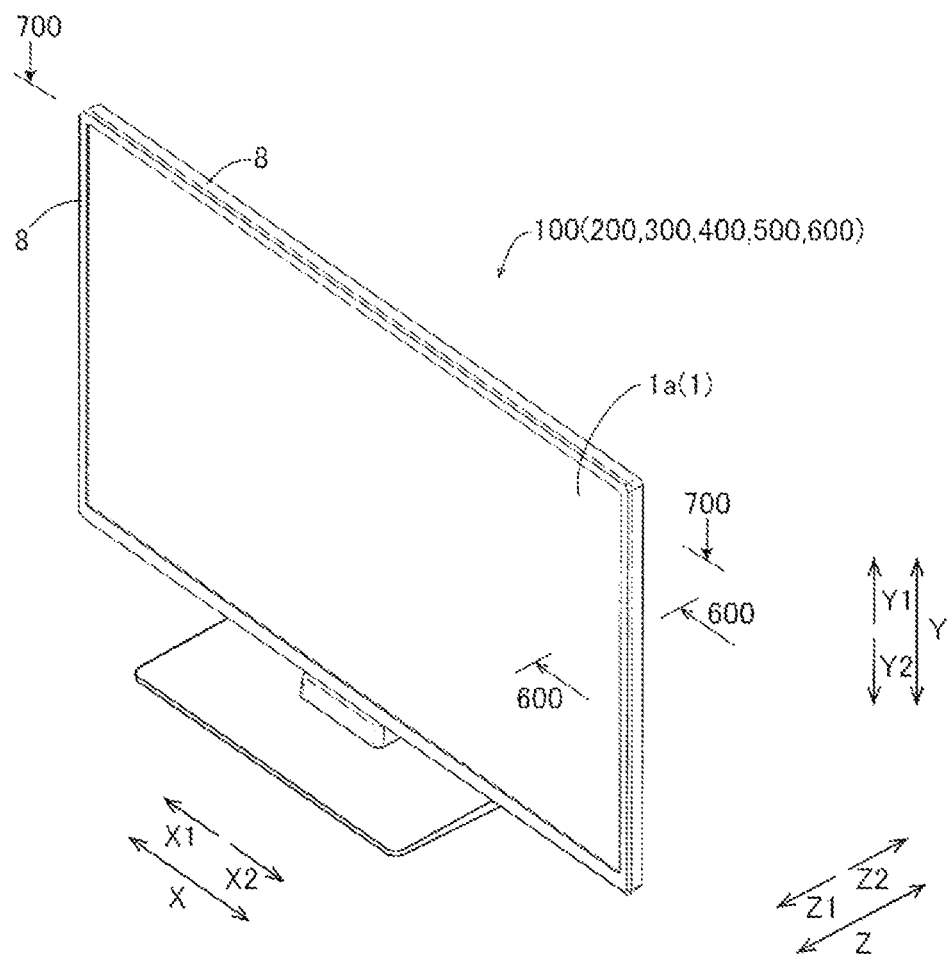
FIG. 1 is a perspective view illustrating an entire television device according to first to fifth embodiments of the disclosure when seen from the front side.
Figure 2:
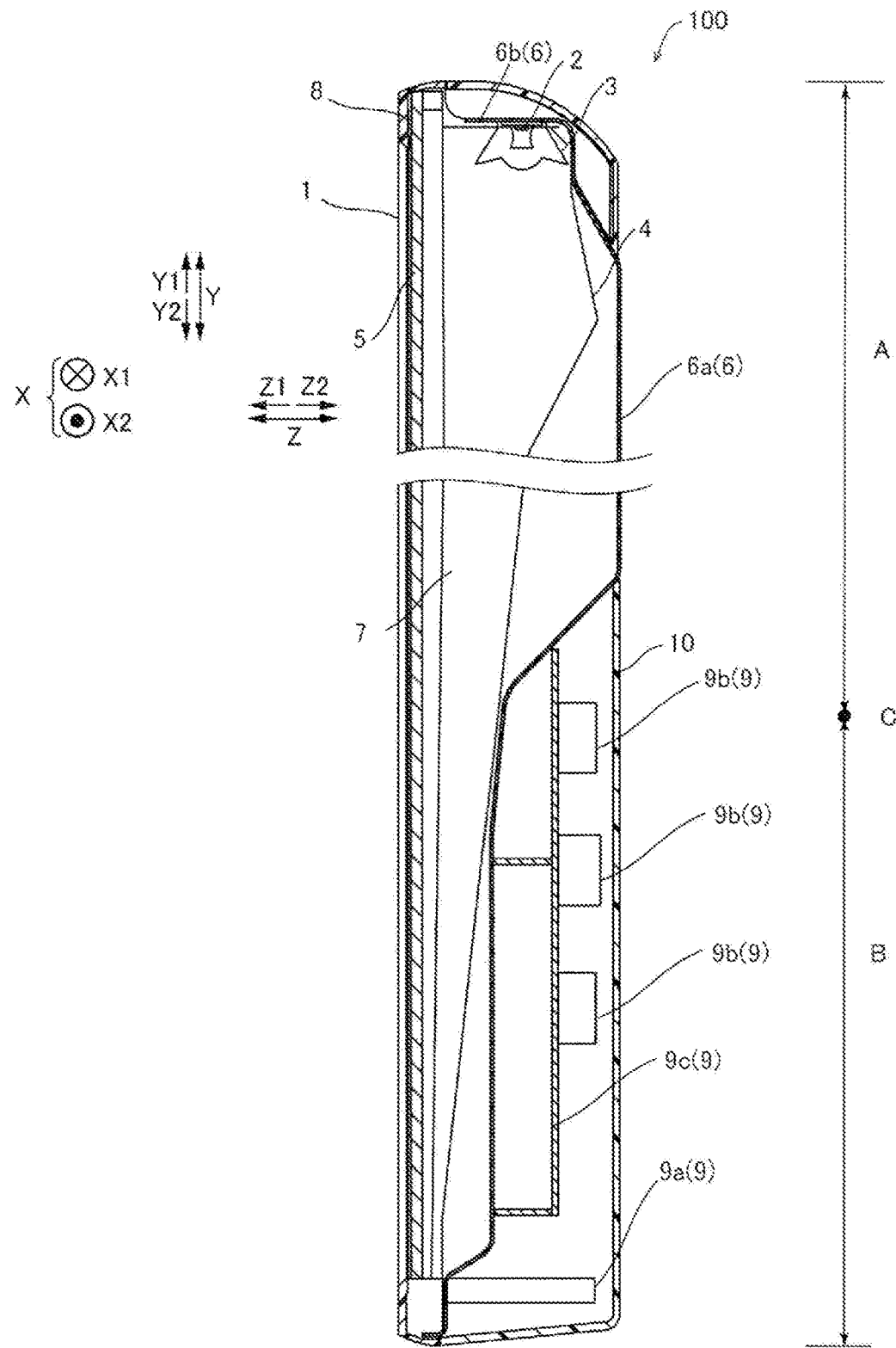
FIG. 2 is a sectional view illustrating the television device taken along the line 600-600 in FIG. 1 according to the first embodiment of the disclosure.

The television device 100 according to the first embodiment of the disclosure includes a display part 1, a light source part 2, a lens 3, a reflection sheet 4, an optical sheet 5, a rear frame 6, and a hollow light-guiding region 7, as illustrated in FIGS. 1 and 2. The display part 1 includes an image display region 1a on which an image is displayed.

In the television device 100, light radiated from the light source part 2 is reflected or refracted by the lens 3 and the light emitted from the lens 3 becomes substantially parallel light and is radiated to the hollow light-guiding region 7. Then, the light radiated to the hollow light-guiding region 7 is reflected to a sloping surface of the reflection sheet 4 and is radiated to the optical sheet 5. Further, the light radiated to the optical sheet 5 is radiated to the display part 1.

The television device 100 is configured such that the light radiated from the light source part 2 is radiated directly from the reflection sheet 4 to the optical sheet 5 via the hollow light-guiding region 7 without being involved in a light-guiding plate.

As illustrated in FIG. 1, a bezel 8 is fitted around the display part 1. The image display region 1a is a portion surrounded by the bezel 8 of the display part 1. On the image display region 1a, an image is displayed with the light radiated from the optical sheet 5.

Hereinafter, a direction in which a user views the display part 1 is referred to as a Z2 direction, a direction opposite to this direction is referred to as a Z1 direction, and the Z1 and Z2 directions are collectively referred to as a Z direction. Of the direction vertically orthogonal to the Z direction, a longitudinal direction of the display part 1 is referred to as an X direction and a transverse direction is referred to as a Y direction. A Z1 side refers to a front surface and a Z2 side refers to a rear surface. As illustrated in FIG. 2, an upper portion A refers to a side above a center C and a lower portion B refers to a side below the center C in the Z direction when seen in the transverse direction (the Y direction). Both ends (portions) D refer to ends in both directions in the longitudinal direction (the X direction) or the transverse direction (the Y direction) and a range of the periphery of the end portions, and a center (portion) E refers to portions other than the end portions and refers to a range including a central point halving a distance in the longitudinal direction or the transverse direction.

Figure 3:
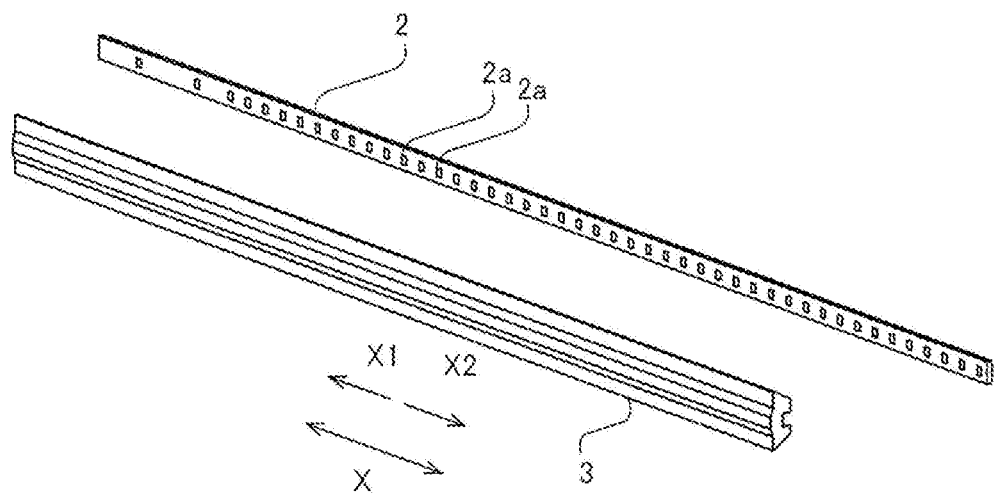
FIG. 3 is a perspective view illustrating a lens and a light source part of the television device according to the first embodiment of the disclosure.

As illustrated in FIGS. 2 and 3, in the first embodiment, the light source part 2 is mounted in the upper portion of the display device 100. The light source part 2 includes a plurality of light-emitting diodes (LEDs) 2a. The LEDs 2a are disposed to be arrayed in a straight line shape in the longitudinal direction (the X direction) of the display part 1.

Figure 4:
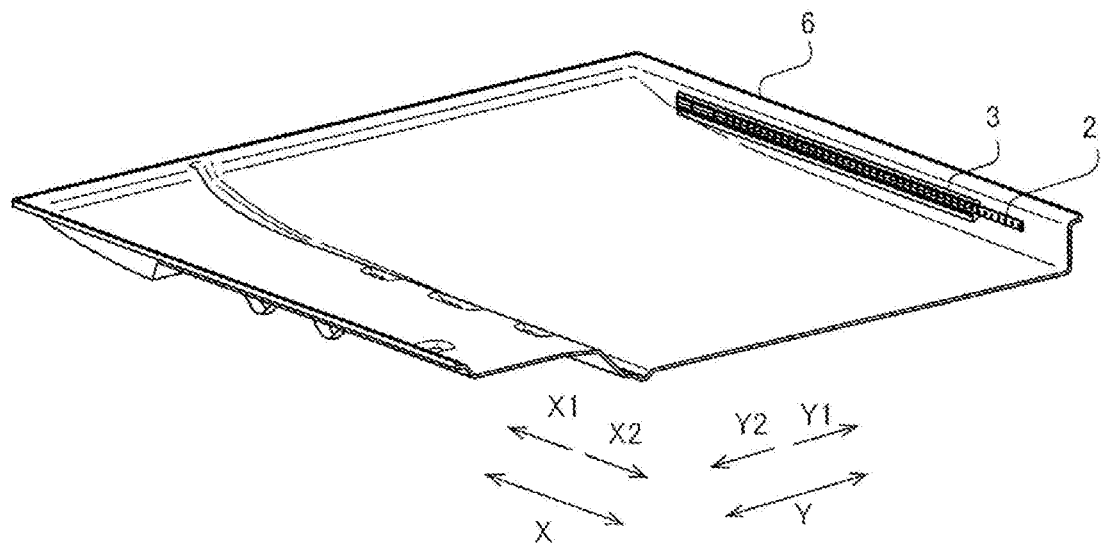
FIG. 4 is a schematic view illustrating a form in which the lens and the light source part of the television device according to the first embodiment of the disclosure are mounted on a rear frame.
Figure 5:
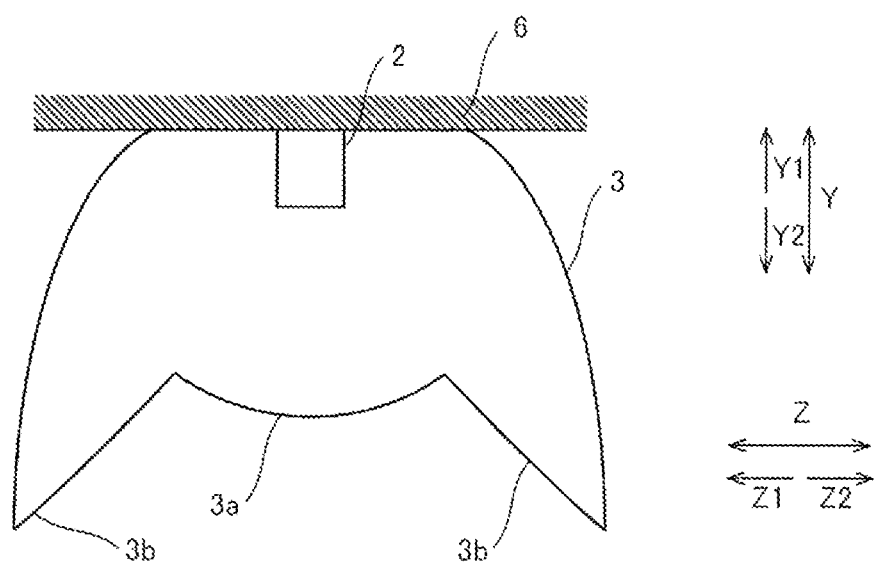
FIG. 5 is a schematic view illustrating a configuration of the lens of the television device according to the first embodiment of the disclosure.

As illustrated in FIGS. 2 and 4, the light source part 2 and the lens 3 are mounted on a rear frame 6 on the rear surface side (the X2 side) of the image display region 1a. In FIG. 4, the light source part 2 and the lens 3 similarly extend although illustrated by only half of the rear frame 6. In FIG. 4, the light source part 2 is exposed for easy understanding, but the light source part 2 is completely covered with the lens 3. The lens 3 is mounted to extend in the longitudinal direction (the X direction) to cover the light source part 2. As illustrated in FIG. 5, the lens 3 includes a refraction surface 3a disposed to be curved on the downward side (the Y2 direction) of the light source part 2 and a reflection surface 3b disposed on the lateral side (the Y direction intersecting the Z direction) of the light source part 2 to interpose the refraction surface 3a. The lens 3 reflects and refracts the light from the light source part 2 to form substantially parallel light.

Figure 6:
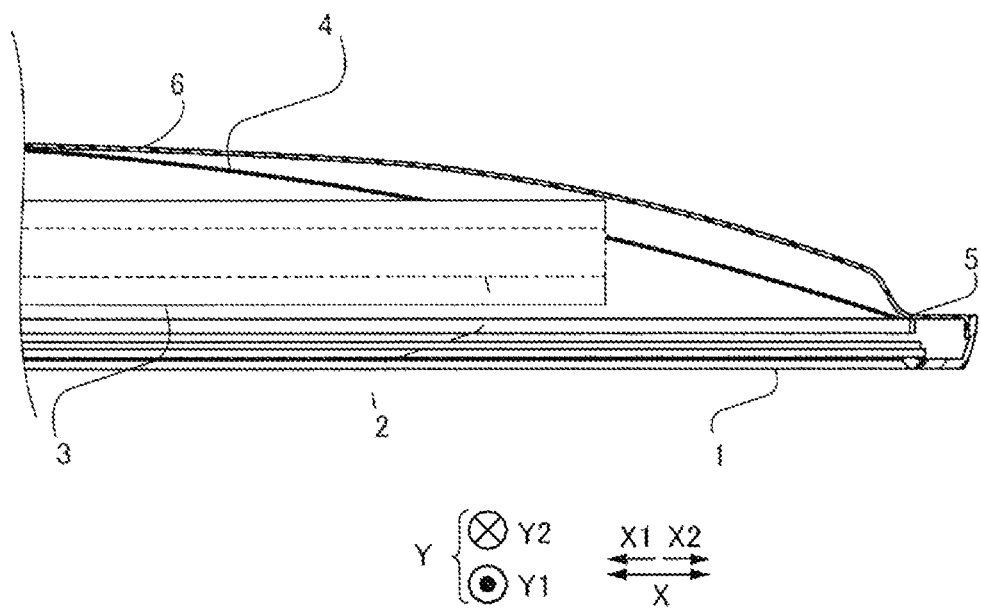
FIG. 6 is a sectional view illustrating the television device taken along the line 700-700 according to the first embodiment of the disclosure.

As illustrated in FIG. 6, the reflection sheet 4 includes a reflection surface that reflects the light toward the display part 1 (the front side). Both of the ends D of the lower portion B of the reflection sheet 4 slope to close to the optical sheet 5. Although only the half of the reflection sheet 4 is illustrated in FIG. 6, the reflection sheet 4 is also close to the optical sheet 5 similarly on the opposite side.

The optical sheet 5 is formed of a diffusion plate, a polarization filter, or the like and the display part 1 is disposed between the display part 1 and the reflection sheet 4. Thus, the light radiated from the light source part 2 is radiated to the optical sheet 5 and diffusion and polarization directions can be arrayed by the optical sheet 5. The optical sheet 5 may be formed of a combination of a plurality of sheets that has a predetermined function without being limited to a case in which the optical sheet 5 is formed of one sheet.

As illustrated in FIG. 2, the rear frame 6 covers the reflection sheet 4 from the rear surface side (the Z2 side). The rear frame 6 includes a rear surface part 6a that extends in the Y direction and a flat surface part 6b that is bent toward the upper portion A and the lower portion B on the side of the display part 1. The light source part 2 is mounted on the flat surface part 6b of the upper portion A. For example, the flat surface part 6b of the upper portion A is provided to be perpendicular to the display part 1.

As illustrated in FIG. 2, a distance between the rear frame 6 and the display part 1 according to the first embodiment is shorter in the lower portion B than in the upper portion A of the rear frame 6. Component parts 9 are mounted on the rear surface side (the Z2 side) of the lower portion of the rear frame 6. The component parts 9 are a substrate 9c on which a speaker 9a and electronic components 9b are mounted, and the like.

Figure 7:
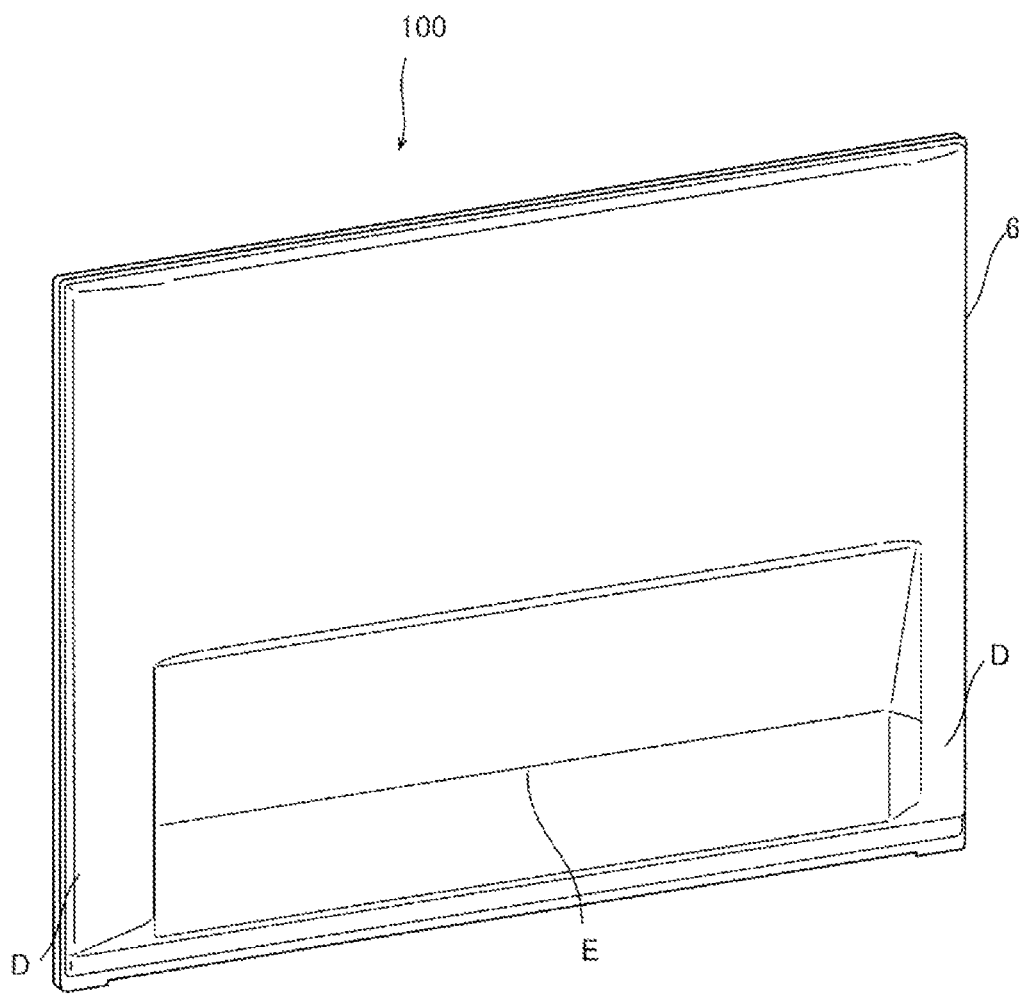
FIG. 7 is a perspective view illustrating a rear surface side of the television device according to the first embodiment of the disclosure.

In the lower portion B of the rear frame 6, a distance to the optical sheet 5 at both ends D is greater than a distance to the optical sheet 5 at a center E in the longitudinal direction. As illustrated in FIG. 7, both ends D of the lower portion of the rear frame 6 protrude in the rear surface direction. When the component parts 9 are mounted in the center E of the rear frame 6, the component parts 9 may be fixed by, for example, screws.

In the portions in which the component parts 9 in the lower portion B of the rear frame 6 are mounted, a protective cover 10 is mounted so that a user does not touch the component parts 9 at high temperature. As illustrated FIG. 2, the distance between the protective cover 10 and the display part 1 is the same as the distance between the display part 1 and the rear surface part 6a of the rear frame 6. However, the distance between the protective cover 10 and the display part 1 may be set to be less than the distance between the display part 1 and the rear surface part 6a of the rear frame 6.

Advantages of First Embodiment

In the first embodiment, the following advantages can be obtained.

In the first embodiment, as described above, the light source part 2, the optical sheet 5, and the rear frame 6 are included, the light source part 2 is disposed in the upper portion of the television device 100, and the hollow light-guiding region 7 is provided between the reflection sheet 4 and the optical sheet 5. In the reflection sheet 4, the distance to the optical sheet 5 is less in the lower portion B than in the upper portion A. Thus, when the hollow light-guiding region 7 is provided, it is unnecessary to provide a light-guiding plate. Therefore, since the distance between the reflection sheet 4 and the optical sheet 5 in the lower portion B of the television device 100 can be reduced, a space can be provided in the lower portion B to that extent. Thus, the component parts 9 can be disposed in the space of the lower portion B. When the light source part 2 is provided in the upper portion, it is unnecessary to provide a space equivalent to the thickness in the front and rear directions of the light source part 2 in the lower portion B. Therefore, it is possible to reduce the entire thickness of the television device 100 and prevent temperature of the lower portion B of the television device 100 from being high.

In addition, in the first embodiment, as described above, the distance to the optical sheet 5 in the lower portion B of the rear frame 6 is less than the distance to the optical sheet 5 in the upper portion A of the rear frame 6. Thus, since the length of the lower portion B of the rear frame 6 in the front and rear directions can be reduced, it is possible to prevent the thickness in the front and rear directions of the television device 100 from increasing when the component parts 9 are mounted on the rear surface side of the lower portion of the rear frame 6.

In addition, in the first embodiment, as described above, the component parts 9 are mounted on the rear surface side of the lower portion of the rear frame 6. In such a configuration, since the component parts 9 can be mounted in the space provided in the rear surface side of the lower portion of the rear frame 6, it is possible to reliably reduce the entire thickness of the television device 100.

In addition, in the first embodiment, as described above, the component parts 9 include the substrate 9c on which the speaker 9a and the electronic components 9b are mounted. In this way, since the light source part 2 and the substrate 9c on which the electronic components 9b emitting heat are mounted are provided separately in the lower portion B and the upper portion A, it is possible to prevent the temperature of the lower portion of the television device 100 from being high. In addition, it is possible to prevent an influence of the heat emitted from the component parts 9 on the light source part 2 from occurring.

In addition, in the first embodiment, as described above, in the longitudinal direction of the rear frame 6, the lower portion of the rear frame 6 is configured such that the distance to the optical sheet 5 at both ends D is greater than the distance to the optical sheet 5 in the middle portion. In this way, by mounting the component parts 9 in the middle portion in which the distance to the optical sheet 5 is small in the rear frame 6, it is possible to reduce the entire thickness in the front and rear directions of the television device 100. By increasing the distance to the optical sheet 5 in the portions of both ends D of the rear frame 6 in the longitudinal direction, both end portions in the longitudinal direction of the rear frame 6 protrude, thereby sufficiently remaining the strength of the rear frame 6.

In addition, in the first embodiment, as described above, the distance between the reflection sheet 4 and the optical sheet 5 is less at both ends D in the longitudinal direction of the reflection sheet 4 than in the center E. In this way, the middle portion of the reflection sheet 4 protrudes on the rear surface side and the reflection sheet 4 is closer to the optical sheet 5 at both ends in the longitudinal direction. Thus, when the rear frame 6 is mounted along the reflection sheet 4, the distance from the display part 1 to the rear frame 6 can be reduced at both end portions in the longitudinal direction. Therefore, it is possible to reduce the thickness in the front and rear directions of both end portions in the longitudinal direction of the television device 100.

In addition, in the first embodiment, the light source part 2 is disposed on the rear surface side of the image display region 1a surrounded by the bezel 8 of the display part 1. In this way, since it is unnecessary to increase a width equivalent to the frame of the bezel 8 in conformity with the height of the light source part 2, it is possible to reduce the width of the bezel 8.

Second Embodiment

Next, a second embodiment will be described with reference to FIGS. 1, 8, and 9. A television device 200 according to the second embodiment further includes a reflection member 11 in addition to the configuration of the television device 100 of the first embodiment. The same reference numerals are given to similar parts to those of the first embodiment and description thereof will be omitted.

Figure 8:
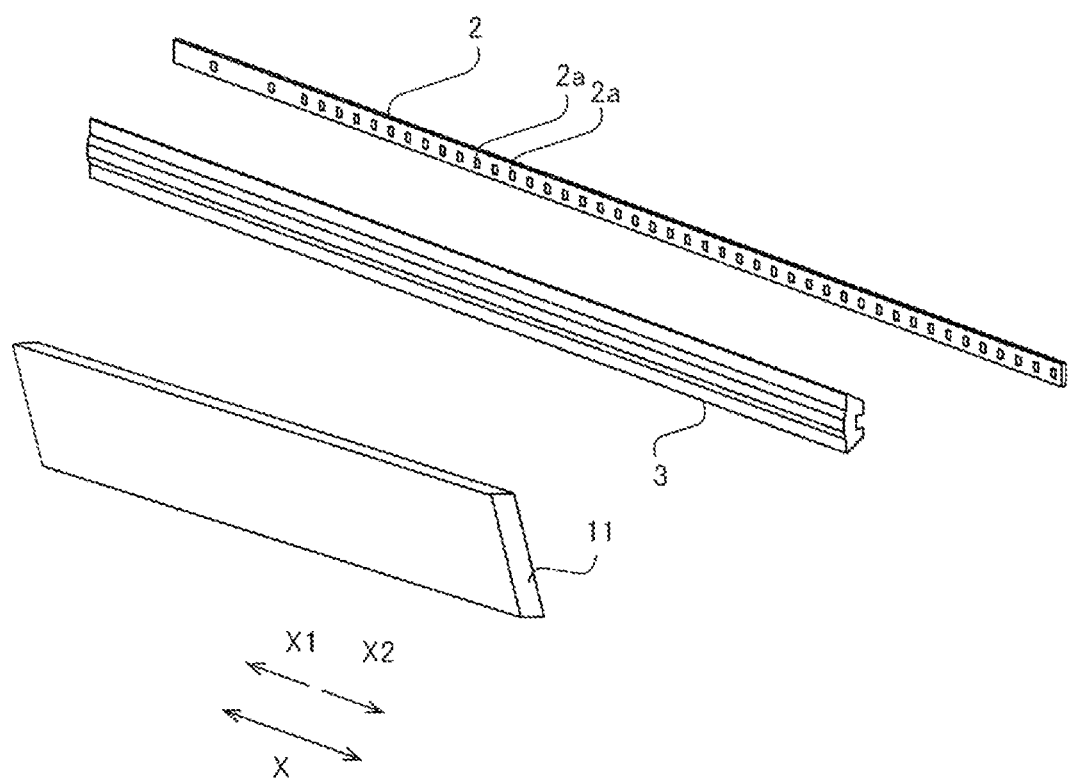
FIG. 8 is a perspective view illustrating a lens, a light source part, and a reflection member of a television device according to a second embodiment of the disclosure.
Figure 9:
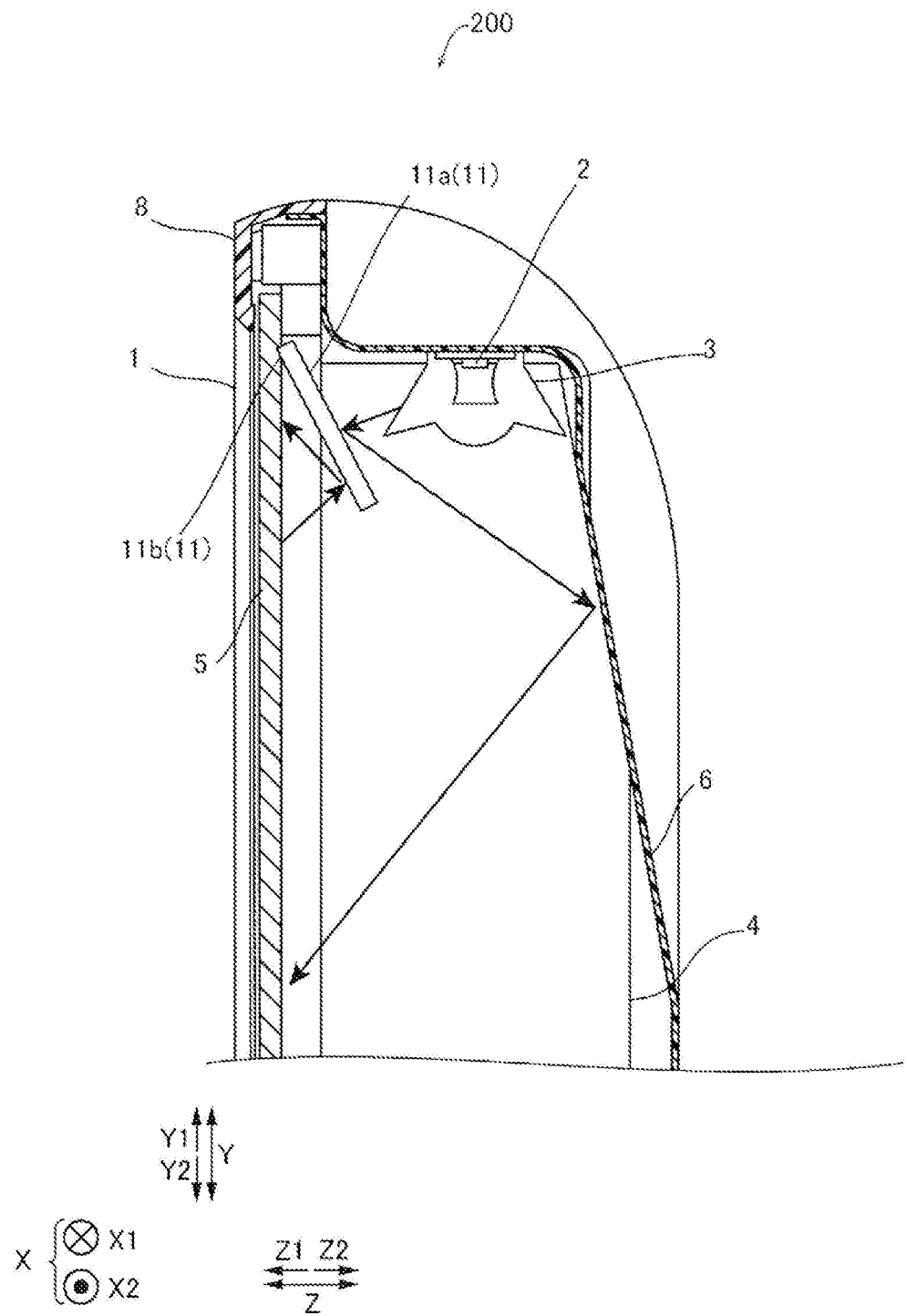
FIG. 9 is a partial sectional view illustrating the television device taken along the line 600-600 according to the second embodiment of the disclosure.

As illustrated in FIG. 8, the reflection member 11 is mounted in a direction in which the LEDs 2a extend. As illustrated in FIG. 9, the reflection member 11 is mounted on the rear surface side (the Z2 side) of the image display region 1a in the upper portion as in the light source part 2. The reflection member 11 has a surface 11a that reflects light emitted from the lens 3 and a surface 11b that reflects light radiated from the optical sheet 5 on both sides. In FIG. 9, examples of reflection of the light are indicated by arrows.

The reflection member 11 reflects light leaking from the lens 3 in the Z1 direction to the reflection sheet 4 on the rear surface side. Thus, it is possible to prevent much light from being radiated to the optical sheet 5 close to the light source part 2 and prevent luminance of the display part 1 in the upper portion A close to the light source part 2 from locally increasing.

The reflection member 11 is mounted to slope with respect to the optical sheet 5. In the second embodiment, the reflection member 11 slopes to be distant from the optical sheet 5 toward the lower portion B. By sloping the reflection member 11 to be distant from the optical sheet 5, the light reflected by the optical sheet 5 is reflected to the optical sheet 5. Thus, luminance of a portion that has less luminance in the optical sheet 5 is supplemented.

The other configuration of the second embodiment is similar to that of the first embodiment.

Advantages of Second Embodiment

In the second embodiment, the following advantages can be obtained.

In the second embodiment, as described above, the plurality of LEDs 2a is disposed to extend in the longitudinal direction of the display part 1. The reflection member 11 that is mounted to extend in the longitudinal direction of the display part 1 in the direction in which the plurality of LEDs 2a extend and reflects light emitted from the lens 3 is further included. In this way, even when the light source part 2 is provided in the image display region 1a, the light emitted from the lens 3 is reflected by the reflection member 11. Therefore, since the light leaking from the lens 3 arrives at the optical sheet 5, it is possible to prevent the luminance of the display part 1 located near the light source part 2 from increasing.

In the second embodiment, as described above, the reflection member 11 is disposed to slope with respect to the optical sheet 5 and the light reflected by the optical sheet 5 in the light-guiding region 7 is reflected toward the optical sheet 5. In such a configuration, it is possible to radiate the light from the light source part 2 to the optical sheet 5 at which no light arrives since the light is blocked by the reflection member 11. Therefore, it is possible to prevent a spot with small luminance from occurring.

The other advantages of the second embodiment are similar to those of the first embodiment.

Third Embodiment

Next, a third embodiment will be described with reference to FIGS. 1 and 10. In a television device 300 according to the third embodiment, the rear frame 6 slopes from the middle portion to the end portions to be close to the optical sheet 5. The same reference numerals are given to similar parts to those of the first embodiment and description thereof will be omitted.

Figure 10:
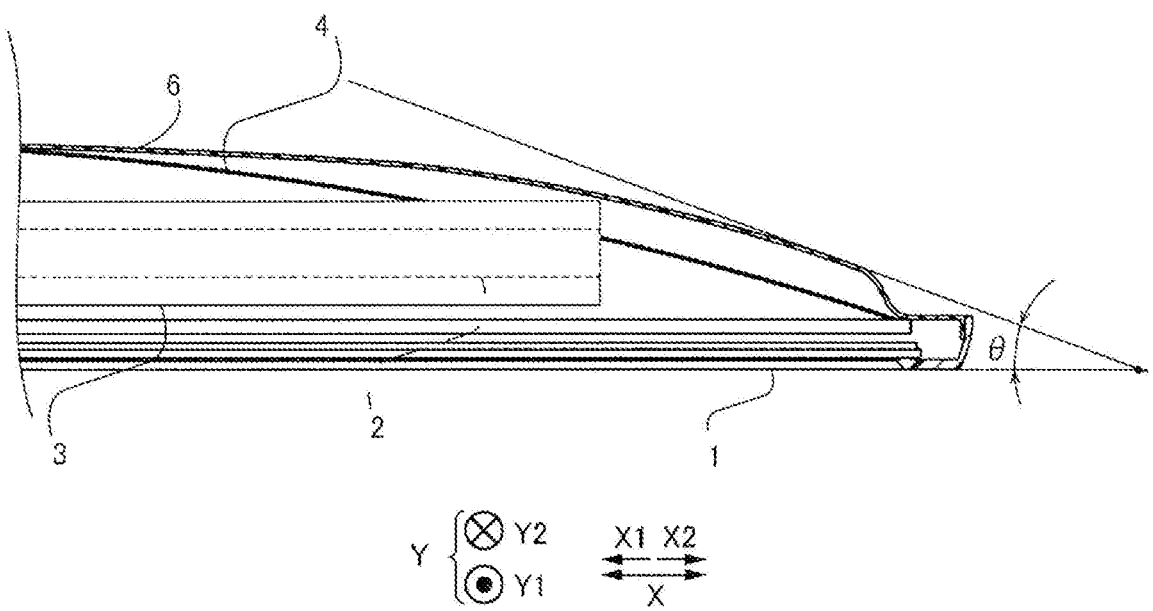
FIG. 10 is a sectional view illustrating a television device taken along the line 700-700 according to a third embodiment of the disclosure.

As illustrated in FIG. 10, the rear frame 6 is formed in an arc shape from the middle portion to the end portion. A slope angle θ is an angle between a tangential line of the rear frame 6 and an extension line in the longitudinal direction of the display part 1.

The slope angle θ is preferably equal to or less than 35 degrees and is more preferably equal to or less than 20 degrees. The slope angle θ is set so that the protective cover 10 or the like of the rear surface part is not seen when seen obliquely from the front surface. By approaching the reflection sheet 4 to the optical sheet 5 so that a difference between a distance between the reflection sheet 4 and the optical sheet 5 in the middle portion in the longitudinal direction of the reflection sheet 4 and a distance between the reflection sheet 4 and the optical sheet 5 at both ends increases and providing the rear frame 6 along the reflection sheet 4, it is possible to reduce the slope angle θ of the rear frame 6.

The other configuration of the third embodiment is similar to that of the first embodiment.

Advantages of Third Embodiment

In the third embodiment, the following advantages can be obtained.

In the third embodiment, as described above, the rear frame 6 slopes from the middle portion to the end portions to be close to the optical sheet 5 and the slope angle θ is an acute angle of the rear frame 6 with respect to the optical sheet 5. In such a configuration, when the television device 300 is seen obliquely from the front surface side, it is possible to prevent the component parts 9 mounted on the rear surface side of the rear frame 6 from being seen.

In the third embodiment, as described above, the slope angle θ of the rear frame 6 with respect to the optical sheet 5 is equal to or less than 35 degrees. In this way, when the television device 300 is seen obliquely from the front surface side, it is possible to reliably prevent the component parts 9 mounted on the rear surface side of the rear frame 6 from being seen.

The other advantages of the third embodiment are similar to those of the first embodiment.

Fourth Embodiment

Next, a fourth embodiment will be described with reference to FIGS. 1, 11, and 12. In the fourth embodiment, a first air vent 13 is further included in addition to the configuration of the television device 100 according to the first embodiment. The same reference numerals are given to similar parts to those of the first embodiment and description thereof will be omitted.

Figure 11:
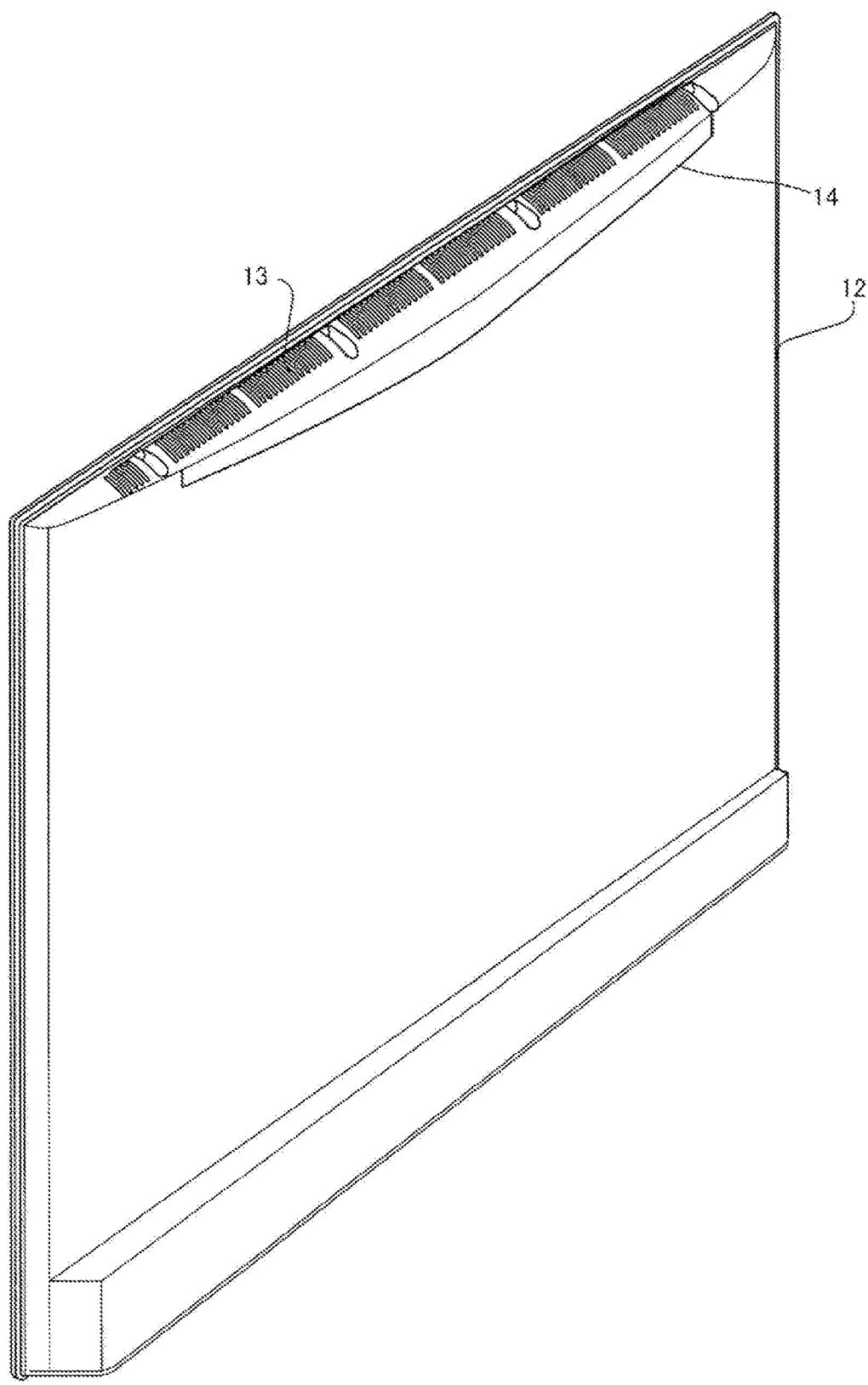
FIG. 11 is a side view illustrating the rear surface of a television device according to a fourth embodiment of the disclosure.

As illustrated in FIG. 11, in a television device 400 according to the fourth embodiment, the first air vent 13 is provided in the cover 12 covering the light source part 2 on the upper surface side and the rear surface side. As illustrated in FIG. 12, the cover 12 covers parts of the upper surface side and the rear surface side of the rear frame 6.

A plurality of holes with a small width is provided in the first air vent 13 so that dust or the like do not enter.

Figure 12:
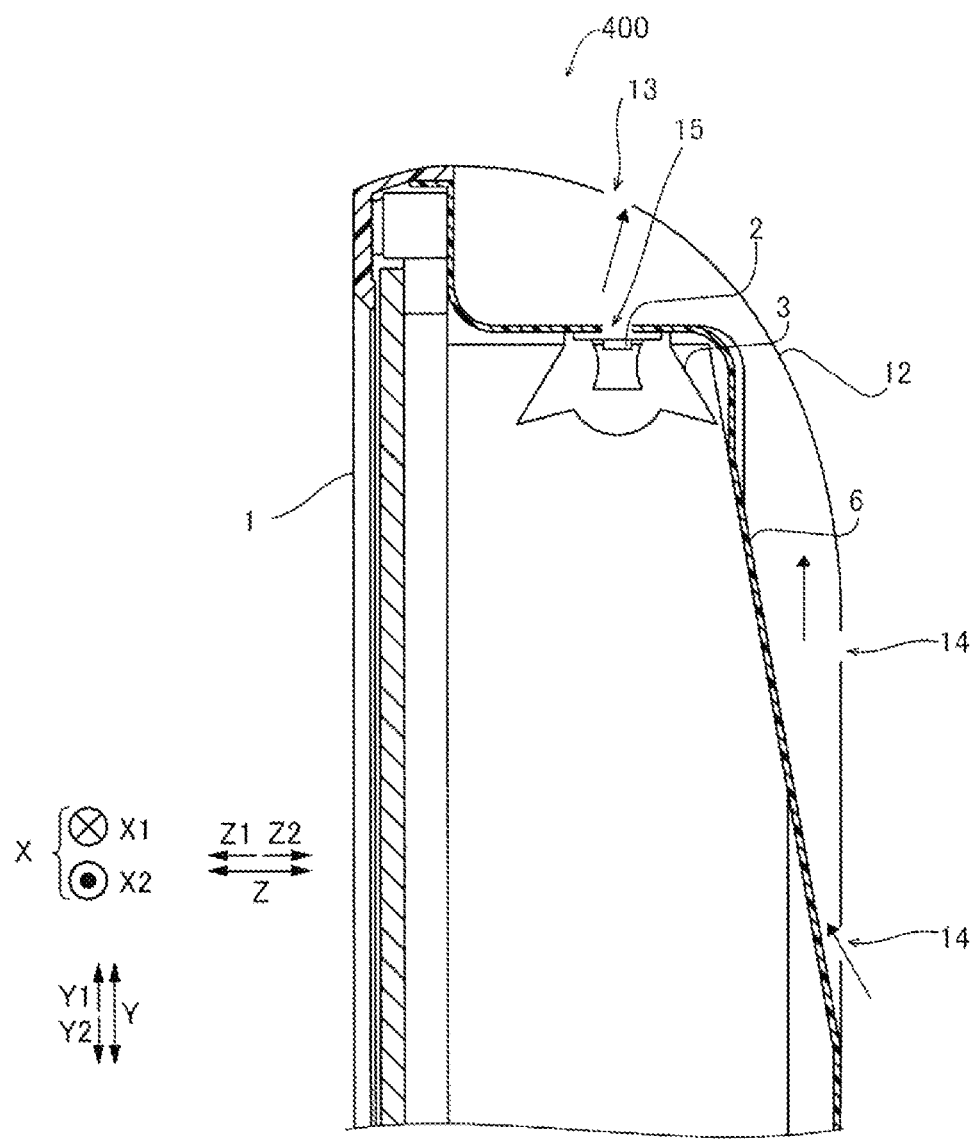
FIG. 12 is a sectional view illustrating the television device taken along the line 600-600 according to the fourth embodiment of the disclosure.

As illustrated in FIGS. 11 and 12, an opening 14 is provided on the rear surface of the cover 12. Outside air flowing from the opening 14 is colder than air heated in the light source part 2. Then, outside air and air at temperature higher than the outside air and heated in the light source part 2 are inside the cover 12. Since air at the high temperature has lower density than air at low temperature and buoyancy occurs, warm air rises, drawing outside cold air from the opening 14 of the cover 12 because of the chimney effect, and thus the heat is discharged from the first air vent 13.

As illustrated in FIG. 12, a second air vent 15 is provided on the upper surface side of the rear frame 6. The second air vent 15 is provided to be located above the light source part 2. For example, the second air vent 15 is provided at a position at which the first air vent 13 and the second air vent 15 overlap in a top view. The sizes of the first air vent 13 and the second air vent 15 may be the same or may be different. The position at which the first air vent 13 and the second air vent 15 overlap in a top view includes a position at which the first air vent 13 and the second air vent 15 partially overlap and a position at which the first air vent 13 and the second air vent 15 are disposed to completely overlap.

As another example in which the second air vent 15 is provided, the second air vent 15 is provided at a position at which the first air vent 13 and the second air vent 15 do not overlap in a top view. The sizes of the first air vent 13 and the second air vent 15 may be the same or may be different. In this case, by disposing the second air vent 15 on the front surface side of the first air vent 13, it is possible to release heat of the light source part 2 efficiently along flow of the air from the opening 14 provided on the rear surface part of the cover 12.

The other configuration of the fourth embodiment is similar to that of the first embodiment.

Advantages of Fourth Embodiment

In the fourth embodiment, the following advantages can be obtained.

In the fourth embodiment, as described above, the television device 400 includes the cover 12 covering the light source part 2 on the upper surface side and the rear surface side and the first air vent 13 is provided on the upper surface side of the cover 12. In this way, the cover prevents the user from to directly touching the light source part 2 in a high temperature state and the first air vent 13 can release heat of the light source part 2 emitted via the rear frame 6.

In the fourth embodiment, as described above, the opening 14 is provided on the rear surface side of the cover 12. In this way, the air heated by the light source part 2 has a higher temperature than outside air and has a lower density than outside air. Therefore, buoyancy occurs in the air heated by the light source part 2 and the air rises, taking in the outside air at low temperature from the opening 14 because of the chimney effect, and is discharged from the first air vent 13. Thus, it is possible to release the heat generated in the light source part 2.

In the fourth embodiment, as described above, the second air vent 15 is provided on the upper surface side of the rear frame 6 and is provided at a position at which the first air vent 13 and the second air vent 15 overlap in a plan view. In this way, since the heat generated in the light source part 2 is released upward via the second air vent 15 and the first air vent 13, it is possible to improve heat dissipation efficiency.

In the fourth embodiment, as described above, the second air vent 15 is provided at the position at which the first air vent 13 and the second air vent 15 do not overlap in a plan view. In this way, after the air heated due to the heat from the light source part 2 is discharged from the second air vent 15 and moves from the second air vent 15 to the first air vent 13 due to flow of air flowing in from the opening 14 on the rear surface side of the cover, the air is discharged from the first air vent 13 to the outside. As a result, it is possible to cool the light source part 2 efficiently.

The other advantages of the fourth embodiment are similar to those of the first embodiment.

Fifth Embodiment

Next, a television device 500 according to a fifth embodiment will be described with reference to FIGS. 1, 13, and 14. In the fifth embodiment, a light source base 16 is further included in addition to the configuration of the television device 100 according to the first embodiment. The same reference numerals are given to similar parts to those of the first embodiment and description thereof will be omitted.

Figure 13:
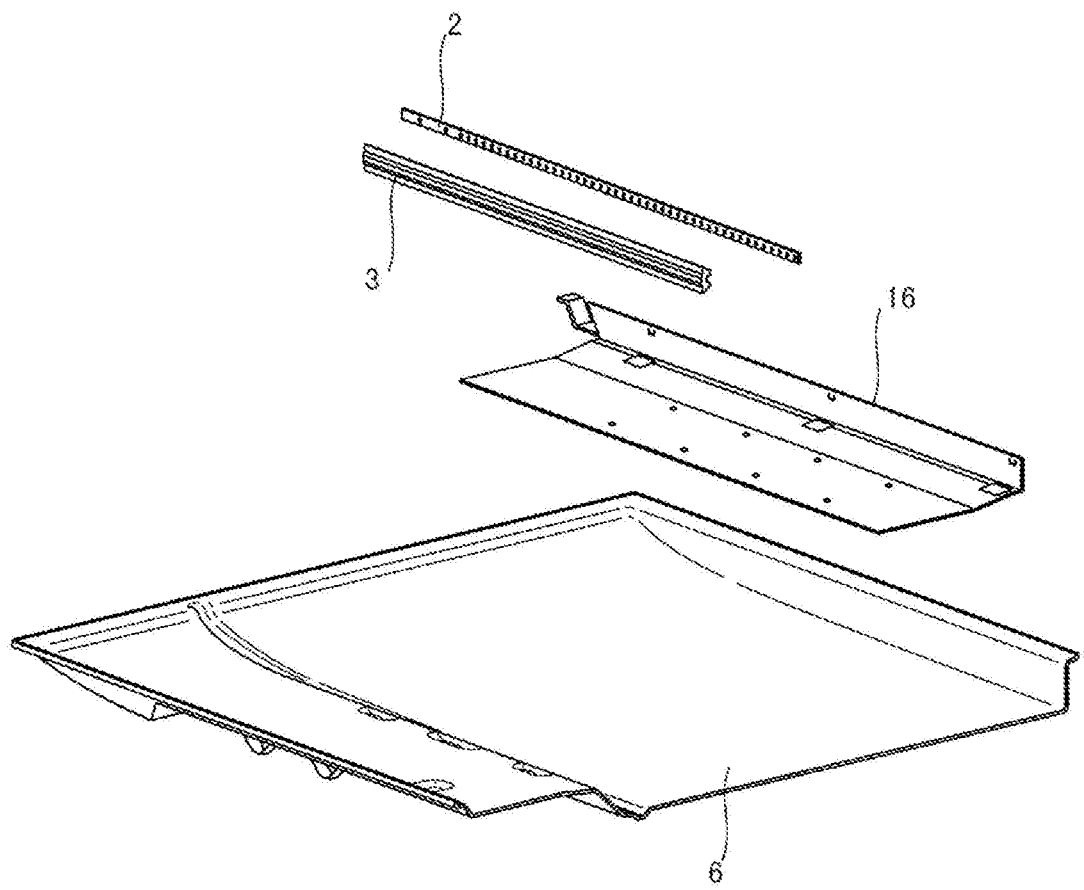
FIG. 13 is a schematic view illustrating a lens, a light source part, and a light source base of a television device according to a fifth embodiment of the disclosure.
Figure 13:
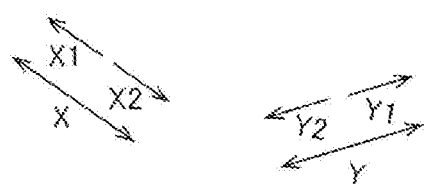
Figure 14:
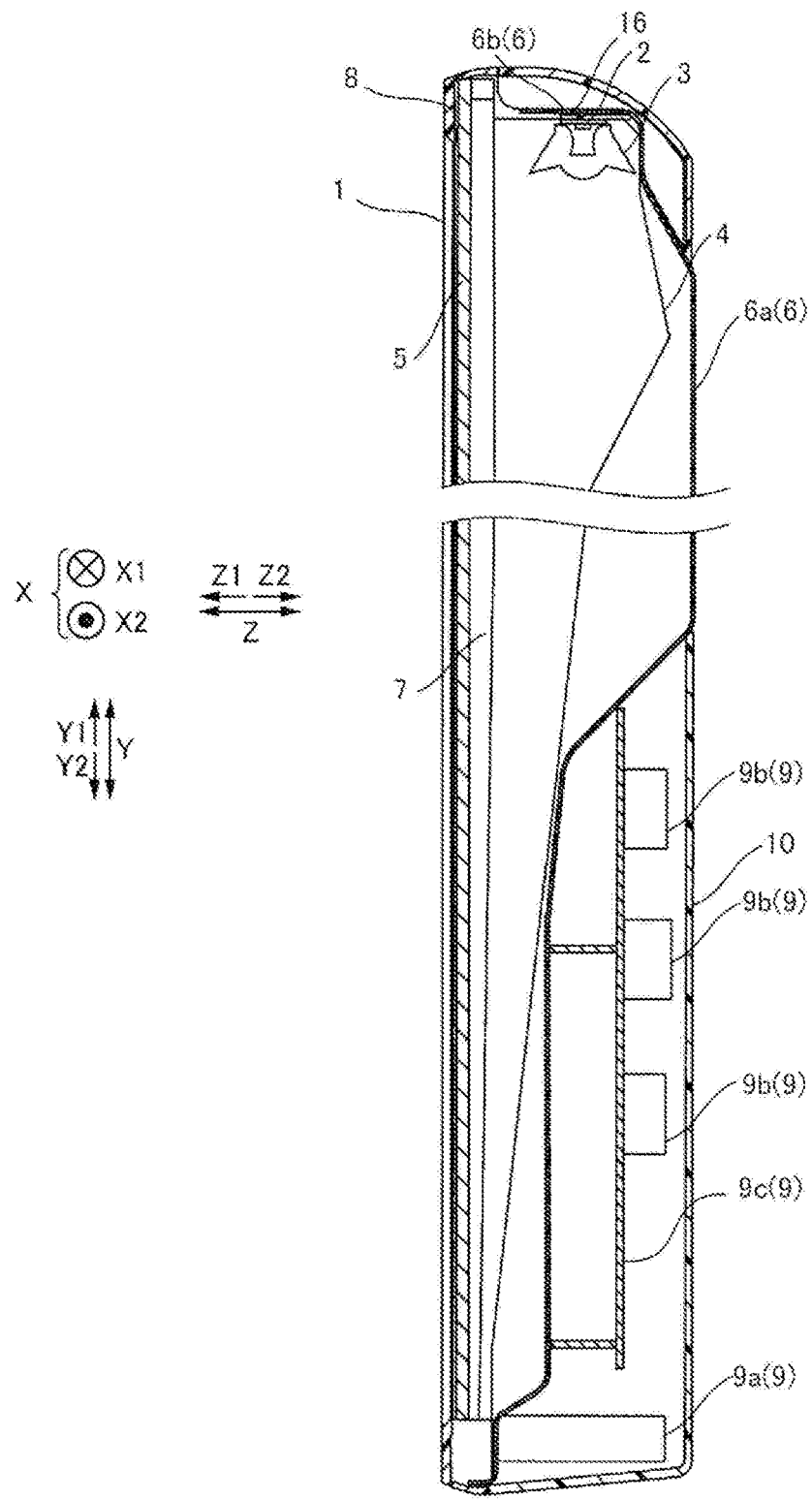
FIG. 14 is a sectional view illustrating the television device taken along the line 600-600 according to the fifth embodiment of the disclosure.

As illustrated in FIGS. 13 and 14, in the fifth embodiment, the light source part 2 is mounted on the rear frame 6 via the light source base 16. The mounting method may be, for example, screwing. Although only the half of the reflection sheet 4 is illustrated in FIG. 13, the remaining portion also has a similar configuration.

The light source base 16 has heat dissipation greater than heat dissipation of the rear frame 6. The heat dissipation refers to heat conductivity, heat emissivity, heat capacity, or the like. It is possible to improve heat dissipation by manufacturing the light source base 16 using an aluminum material while manufacturing the rear frame 6 using, for example, a steel plate. The light source base 16 may be, for example, an L shape or may be flat.

The other configuration of the fifth embodiment is similar to that of the first embodiment.

Advantages of Fifth Embodiment

In the fifth embodiment, the following advantages can be obtained.

In the fifth embodiment, as described above, the light source part 2 is mounted on the rear frame 6 via the light source base 16. The light source base 16 has heat dissipation greater than the heat dissipation of the rear frame 6. In this way, since heat is efficiently dissipated from the light source part 2 by the light source base 16, efficient heat removal can be realized even when an amount of heat from the light source part 2 increases.

The other advantages of the fifth embodiment are similar to those of the first embodiment.

Modification Examples

In addition, embodiments disclosed here are considered to be merely exemplary in terms of all points without being limited. The scope of the disclosure is not described in the foregoing embodiments, but is described in the claims and includes all modifications (modification examples) within the meaning and scope equivalent the claims.

For example, in the foregoing first to fifth embodiments, the examples in which the disclosure is applied to a television device has been described, but the disclosure may be applied to display devices other than a television device.

In addition, in the foregoing first to fifth embodiments, the examples in which light from the light source part is refracted and reflected have been described, but the disclosure is not limited thereto. In the disclosure, the lens may realize only one of the reflection and refraction.

In addition, in the foregoing first to fifth embodiments, the examples in which the light source part is provided in the upper portion of the television device (the display device) have been described, but the disclosure is not limited thereto. In the disclosure, the light source part may be provided at an end portion in the longitudinal direction other than the upper portion of the television device (the display device).

In addition, in the foregoing first to fifth embodiments, the examples in which the component parts are mounted in the lower portion on the rear surface side of the rear frame have been described, but the disclosure is not limited thereto. In the disclosure, it is unnecessary to mount the component parts on the rear frame as long as the component parts can be disposed in the space provided in the lower portion of the display device.

In addition, in the foregoing first to fifth embodiments, the examples in which the light source part is mounted on the rear surface side of the display region have been described, but the disclosure is not limited thereto. In the disclosure, the light source part may be provided on the rear surface side.

In addition, in the foregoing second embodiment, the example in which the reflection member slopes to be distant from the optical sheet along the lower portion has been described, but the disclosure is not limited thereto. In the disclosure, the reflection member may slope to be close to the optical sheet.

In addition, in the foregoing third embodiment, the example in which the rear frame has the arc shape from the middle portion to the end portions has been described, but the disclosure is not limited thereto. In the disclosure, the rear frame may be a sloping surface at the slope angle θ from the middle portion to the end portions.

In addition, in the foregoing fourth embodiment, the example in which the cover covers the parts of the upper surface side and the rear surface side of the rear frame has been described, but the disclosure is not limited thereto. In the disclosure, the cover may cover the entire surface of the rear frame.

The display device according to the embodiment of the disclosure includes the light source part, the optical sheet, and the rear frame, as described above. The light source part is disposed in the upper portion of the display device and the hollow light-guiding region is provided between the reflection sheet and the optical sheet. In the reflection sheet, a distance to the optical sheet is less in the lower portion than in the upper portion. In such a configuration, when the hollow light-guiding region is provided, it is unnecessary to provide a light-guiding plate. Therefore, since the distance between the reflection sheet and the optical sheet in the lower portion of the display device can be reduced, a space can be provided in the lower portion to that extent. Thus, the component parts can be disposed in the space of the lower portion. When the light source part is provided in the upper portion, it is unnecessary to provide a space equivalent to the thickness in the front and rear directions of the light source part in the lower portion. Therefore, it is possible to reduce the entire thickness of the display device and prevent temperature of the lower portion of the display device from being high.

In the display device according to the embodiment of the disclosure, the distance to the optical sheet in the lower portion of the rear frame may be less than the distance to the optical sheet in the upper portion of the rear frame. In such a configuration, since the length of the lower portion of the rear frame in the front and rear directions can be reduced, it is possible to prevent the thickness in the front and rear directions of the display device from increasing when the component parts are mounted on the rear surface side of the lower portion of the rear frame.

In the display device according to the embodiment of the disclosure, the component parts may be mounted on the rear surface side of the lower portion of the rear frame. In such a configuration, since the component parts can be mounted in the space provided in the rear surface side of the lower portion of the rear frame, it is possible to reliably reduce the entire thickness of the display device.

In this case, the component parts may include the substrate on which the speaker and the electronic components are mounted. In such a configuration, since the light source part and the substrate on which the component parts emitting heat are mounted are provided separately in the lower portion and the upper portion, it is possible to prevent the temperature of the lower portion of the display device from being high. In addition, it is possible to prevent an influence of the heat emitted from the component parts on the light source part from occurring.

In the display device according to the embodiment of the disclosure, in the longitudinal direction of the rear frame, the lower portion of the rear frame may be configured such that the distance to the optical sheet at both ends is greater than the distance to the optical sheet in the middle portion. In such a configuration, by mounting the component parts in the middle portion in which the distance to the optical sheet is small in the rear frame, it is possible to reduce the entire thickness in the front and rear directions of the display device. By increasing the distance to the optical sheet in the portions of both ends of the rear frame in the longitudinal direction, both end portions in the longitudinal direction of the rear frame protrude, thereby sufficiently remaining the strength of the rear frame.

In the display device according to the embodiment of the disclosure, the distance between the reflection sheet and the optical sheet may be less at both ends in the longitudinal direction of the reflection sheet than in the middle portion. In this way, the reflection sheet has a shape in which the middle portion protrudes on the rear surface side and is closer to the optical sheet at both ends in the longitudinal direction. Thus, when the rear frame is mounted along the reflection sheet, the distance from the display part to the rear frame can be reduced at both end portions in the longitudinal direction. Therefore, it is possible to reduce the thickness in the front and rear directions of both end portions in the longitudinal direction of the display device.

In the display device according to the embodiment of the disclosure, the light source part may be disposed on the rear surface side of the image display region surrounded by the bezel of the display part. In this way, since it is unnecessary to increase a width equivalent to the frame of the bezel in conformity with the height of the light source part, it is possible to reduce the width of the bezel.

In the display device according to the embodiment of the disclosure, the plurality of LEDs may be disposed to extend in the longitudinal direction of the display part. A reflection member mounted to extend in the longitudinal direction of the display part in the direction in which the plurality of LEDs extend and is configured to reflect light emitted from the lens is further included. In this way, even when the light source part is provided in the image display region, the light emitted from the lens is reflected by the reflection member. Therefore, since the light leaking from the lens arrives at the optical sheet, it is possible to prevent the luminance of the display part located near the light source part from increasing.

In this case, the reflection member may be disposed to slope with respect to the optical sheet and reflect the light reflected by the optical sheet in the light-guiding region toward the optical sheet. In such a configuration, it is possible to radiate the light from the light source part to the optical sheet at which no light arrives since the light is blocked by the reflection member. Therefore, it is possible to prevent a spot with small luminance from occurring.

In the display device according to the embodiment of the disclosure, the rear frame may slope from the middle portion to the end portions to be close to the optical sheet and the slope angle may be an acute angle of the rear frame with respect to the optical sheet. In such a configuration, when the display device is seen obliquely from the front surface side, it is possible to prevent the component parts mounted on the rear surface side of the rear frame from being seen.

In this case, the slope angle of the rear frame with respect to the optical sheet may be equal to or less than 35 degrees. In such a configuration, when the television device is seen obliquely from the front surface side, it is possible to reliably prevent the component parts mounted on the rear surface side of the rear frame from being seen.

The display device according to the embodiment of the disclosure includes a cover covering the light source part on the upper surface side and the rear surface side and a first air vent is provided on the upper surface side of the cover. In such a configuration, the cover prevents the user from directly touching the light source part in a high temperature state and the first air vent can release heat of the light source part emitted via the rear frame.

In this case, an opening may be provided on the rear surface side of the cover. In this way, the air heated by the light source part has a higher temperature than outside air and has a lower density than outside air. Therefore, buoyancy occurs in the air heated by the light source part and the air rises, taking in the outside air at low temperature from the opening because of the chimney effect, and is discharged from the first air vent. Thus, it is possible to release the heat generated in the light source part.

In the configuration in which the cover is included, a second air vent is provided on the upper surface side of the rear frame and is provided at a position at which the first air vent and the second air vent overlap in a plan view. In this way, since the heat generated in the light source part is released upwards via the second air vent and the first air vent, it is possible to improve heat dissipation efficiency.

In the configuration in which the cover is included, the second air vent may be provided at the position at which the first air vent and the second air vent do not overlap in a plan view. In this way, after the air heated due to the heat from the light source part is discharged from the second air vent and moves from the second air vent to the first air vent due to flow of air flowing in from the opening on the rear surface side of the cover, the air is discharged outside from the first air vent. As a result, it is possible to cool the light source part efficiently.

In the display device according to the embodiment of the disclosure, the light source part is mounted on the rear frame via the light source base. The light source base has heat dissipation greater than the heat dissipation of the rear frame. In such a configuration, since heat is efficiently dissipated from the light source part by the light source base, efficient heat removal can be realized even when an amount of heat from the light source part increases.

According to the exemplary embodiments of the disclosure, it is possible to provide a display device of which the entire thickness in the front and rear directions can be decreased and in which temperature of the lower portion is prevented from being high by providing the light source part and the substrate at different positions, as described above.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

REFERENCE SIGNS LIST

1 Display part
2 Light source part
2a LED
3 Lens
4 Reflection sheet
5 Optical sheet
6 Rear frame
7 Light-guiding region
8 Bezel
9 Component part
10 Protection cover
11 Reflection member
12 Cover
13 First air vent
14 Opening
15 Second air vent
16 Light source base
100, 200, 300, 400, 500 Television device

What is claimed is:

1. A display device comprising:
   a display part including a display surface on which an image is displayed;
   a light source part including a plurality of LEDs;
   a lens mounted to cover the light source part and to refract and reflect a light of the light source part;
   a reflection sheet provided on a rear surface side opposite to the display surface of the display part and configured to reflect the light refracted and reflected by the lens;
   an optical sheet disposed between the display part and the reflection sheet and configured to be parallel to the display part; and
   a rear frame configured to cover the reflection sheet on the rear surface side,
   wherein the light source part is disposed in an upper portion of the display device in which the plurality of LEDs of the light source part are disposed to be arrayed in a longitudinal direction of the rear frame,
   wherein a hollow light-guiding region is provided between the reflection sheet and the optical sheet, and
   wherein a distance between the reflection sheet and the optical sheet is less in a lower portion than in the upper portion, and a direction extending from the upper portion to the lower portion is orthogonal to the longitudinal direction,
   wherein in the longitudinal direction of the rear frame, the lower portion of the rear frame is configured such that a distance between the optical sheet and the lower portion of the rear frame at both ends is greater than a distance between the optical sheet and the rear frame in a middle portion, wherein
   a distance between the optical sheet and the rear frame gradually decreases from the lower portion to a lower side edge of the display device, and
   a distance between the optical sheet and the rear frame in the lower portion is less than a distance between the optical sheet and the rear frame in the upper portion.

2. The display device according to claim 1, wherein a component part is mounted on a rear surface side of the lower portion of the rear frame.

3. The display device according to claim 2, wherein the component part includes a substrate on which a speaker and an electronic component are mounted.

4. The display device according to claim 1, wherein the distance between the reflection sheet and the optical sheet is less at both ends in the longitudinal direction of the reflection sheet than in the middle portion.

5. The display device according to claim 1, wherein the light source part is disposed on a rear surface side of an image display region surrounded by a bezel of the display part.

6. The display device according to claim 1,
   wherein the display device further comprises a reflection member mounted to extend in the longitudinal direction of the display part in a direction in which the plurality of LEDs extends and to reflect light emitted from the lens.

7. The display device according to claim 6, wherein the reflection member is disposed to slope with respect to the optical sheet and is configured to reflect light reflected by the optical sheet in the light-guiding region toward the optical sheet.

8. The display device according to claim 1,
   wherein the rear frame slopes from the middle portion to the end portions to be close to the optical sheet, and
   wherein a slope angle of the rear frame with respect to the optical sheet is an acute angle.

9. The display device according to claim 8, wherein the slope angle of the rear frame with respect to the optical sheet is equal to or less than 35 degrees.

10. The display device according to claim 1, further comprising:
    a cover configured to cover the light source part on an upper surface side and a rear surface side,
    wherein a first air vent is provided on the upper surface side of the cover.

11. The display device according to claim 10, wherein an opening is provided on the rear surface side of the cover.

12. The display device according to claim 10,
    wherein a second air vent is provided on an upper surface side of the rear frame, and
    wherein the first and second air vents are provided at positions at which the first and second air vents overlap in a plan view.

13. The display device according to claim 10,
    wherein a second air vent is provided on an upper surface side of the rear frame, and
    wherein the first and second air vents are provided at positions at which the first and second air vents do not overlap in a plan view.

14. The display device according to claim 1,
    wherein the light source part is mounted on the rear frame via a light source base, and
    wherein the light source base has a heat dissipation greater than a heat dissipation of the rear frame.

15. The display device according to claim 1, wherein in the middle portion, a space is formed in a rear surface side of the lower portion of the rear frame, and a component part is mounted in the space.

* * * * *